US012805217B2

(12) United States Patent
Kote et al.

(10) Patent No.: US 12,805,217 B2
(45) Date of Patent: Nov. 17, 2026

(54) SUBSTRATE PROCESSING METHOD AND SUBSTRATE PROCESSING APPARATUS

(71) Applicant: Tokyo Electron Limited, Tokyo (JP)

(72) Inventors: Kenichi Kote, Nirasaki City (JP); Takafumi Nogami, Nirasaki City (JP); Kazui Kobayashi, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 525 days.

(21) Appl. No.: 18/264,539

(22) PCT Filed: Jan. 25, 2022

(86) PCT No.: PCT/JP2022/002674
§ 371 (c)(1),
(2) Date: Aug. 7, 2023

(87) PCT Pub. No.: WO2022/168678
PCT Pub. Date: Aug. 11, 2022

(65) Prior Publication Data

US 2024/0047194 A1 Feb. 8, 2024

(30) Foreign Application Priority Data

Feb. 8, 2021 (JP) ................................ 2021-018135

(51) Int. Cl.

| | |
|---|---|
| ***C23C 16/34*** | (2006.01) |
| ***C23C 16/40*** | (2006.01) |
| ***C23C 16/455*** | (2006.01) |
| ***C23C 16/46*** | (2006.01) |
| ***C23C 16/511*** | (2006.01) |

(Continued)

(52) U.S. Cl.
CPC ........ *H10P 14/6336* (2026.01); *C23C 16/345* (2013.01); *C23C 16/402* (2013.01); *C23C 16/45557* (2013.01); *C23C 16/46* (2013.01); *C23C 16/511* (2013.01); *H01J 37/32449* (2013.01); *H01J 37/32724* (2013.01); *H01J 37/32816* (2013.01); *H10P 14/69215* (2026.01); *H10P 14/69433* (2026.01); *H01J 37/32192* (2013.01); *H01J 2237/182* (2013.01); *H01J 2237/332* (2013.01)

(58) Field of Classification Search
None
See application file for complete search history.

(56) References Cited

U.S. PATENT DOCUMENTS

2018/0108534 A1* 4/2018 Shindo ............. H01L 21/31144

FOREIGN PATENT DOCUMENTS

| | | |
|---|---|---|
| JP | H06-093454 A | 4/1994 |
| JP | 2003-077863 A | 3/2003 |

(Continued)

*Primary Examiner* — Shamim Ahmed
*Assistant Examiner* — Bradford M Gates
(74) *Attorney, Agent, or Firm* — Armstrong Teasdale LLP

(57) ABSTRACT

The present disclosure provides a substrate processing method including: a preparation process of placing a target substrate on a stage within a processing container; a first heating process of supplying a first gas into the processing container and heating the target substrate with a heater; a second heating process of stopping the supply of the first gas, supplying a second gas different from the first gas, and heating the target substrate with the heater; and a processing process of processing the target substrate by supplying the second gas and a third gas.

18 Claims, 10 Drawing Sheets

(51) Int. Cl.

| | |
|---|---|
| ***H01J 37/32*** | (2006.01) |
| ***H10P 14/60*** | (2026.01) |
| ***H10P 14/692*** | (2026.01) |
| ***H10P 14/694*** | (2026.01) |

(56) References Cited

FOREIGN PATENT DOCUMENTS

| | | | |
|---|---|---|---|
| JP | 2010-238739 | A | 10/2010 |
| WO | 2005098913 | A1 | 10/2005 |
| WO | 2007013605 | A1 | 2/2007 |

* cited by examiner

FIG. 9

| Gas | Viscosity coefficient [mPa/s] |
|---|---|
| $NH_3$ | 0.0100 |
| He | 0.0196 |
| $N_2$ | 0.0176 |
| Ar | 0.0222 |

SUBSTRATE PROCESSING METHOD AND SUBSTRATE PROCESSING APPARATUS

CROSS-REFERENCE TO RELATED APPLICATIONS

The present application is a U.S. National Stage Entry of International Patent Application No. PCT/JP2022/002674, filed Jan. 25, 2022, which claims the benefit of priority to Japanese Patent Application No. 2021-018135, filed Feb. 8, 2021, each of which is hereby incorporated herein by reference in its entirety.

TECHNICAL FIELD

The present disclosure relates to a substrate processing method and a substrate processing apparatus.

BACKGROUND

In a film forming apparatus that performs film formation on a substrate by chemical vapor deposition (CVD) or the like, the substrate is sufficiently heated by a heater in a stage on which the substrate is placed, and then a film forming reaction proceeds. In recent years, since there has been a demand for high-speed processing through high-temperature processing in order to improve productivity, substrates are heated rapidly, which may cause the substrates to warp. When a substrate is warped, misalignment or the like may be caused on the substrate during transportation, and when the substrate is placed on a stage, the peripheral edge of the substrate may come into contact with the stage, causing particles to be generated. Therefore, it is required to prevent a substrate from warping during substrate processing at a high temperature.

As a method for suppressing the warping of a substrate, a method including preheating in which the substrate is heated in advance before film formation processing is known (see, for example, Patent Documents 1 and 2). Patent Document 1 discloses a method of gradually heating a substrate with radiant heat from a heater in a stage in a state in which the substrate is supported by support pins, thereby relaxing thermal stress, and then further performing preheating by placing the substrate on the stage, thereby shortening a preheating time. Patent Document 2 discloses a method of placing a substrate on a stage and performing preheating by using plasma, thereby shortening a preheating time.

PRIOR ART DOCUMENTS

Patent Documents

Patent Document 1: Japanese Patent Laid-Open Publication No. 2003-77863

Patent Document 2: Japanese Patent Laid-Open Publication No. 2010-238739

Patent Document 3: International Publication No. WO2005/098913

Patent Document 4: International Publication No. WO2007/013605

The present disclosure provides a technique for shortening a time required for preheating a substrate before film formation while suppressing warping of the substrate.

SUMMARY

In view of the above problems, the present disclosure provides a substrate processing method including: a preparation process of placing a target substrate on a stage within a processing container; a first heating process of heating the target substrate with a heater by supplying a first gas into the processing container; a second heating process of stopping the supply of the first gas, supplying a second gas different from the first gas, and heating the target substrate with the heater; and a processing process of processing the target substrate by supplying the second gas and a third gas.

It is possible to shorten a time required for preheating a substrate before film formation while suppressing warping of the substrate.

BRIEF DESCRIPTION OF DRAWINGS

FIG. 9 is a view illustrating an example of viscosity coefficients of $NH_3$ gas, He gas, $N_2$ gas, and Ar gas.

DETAILED DESCRIPTION

Figure 1:
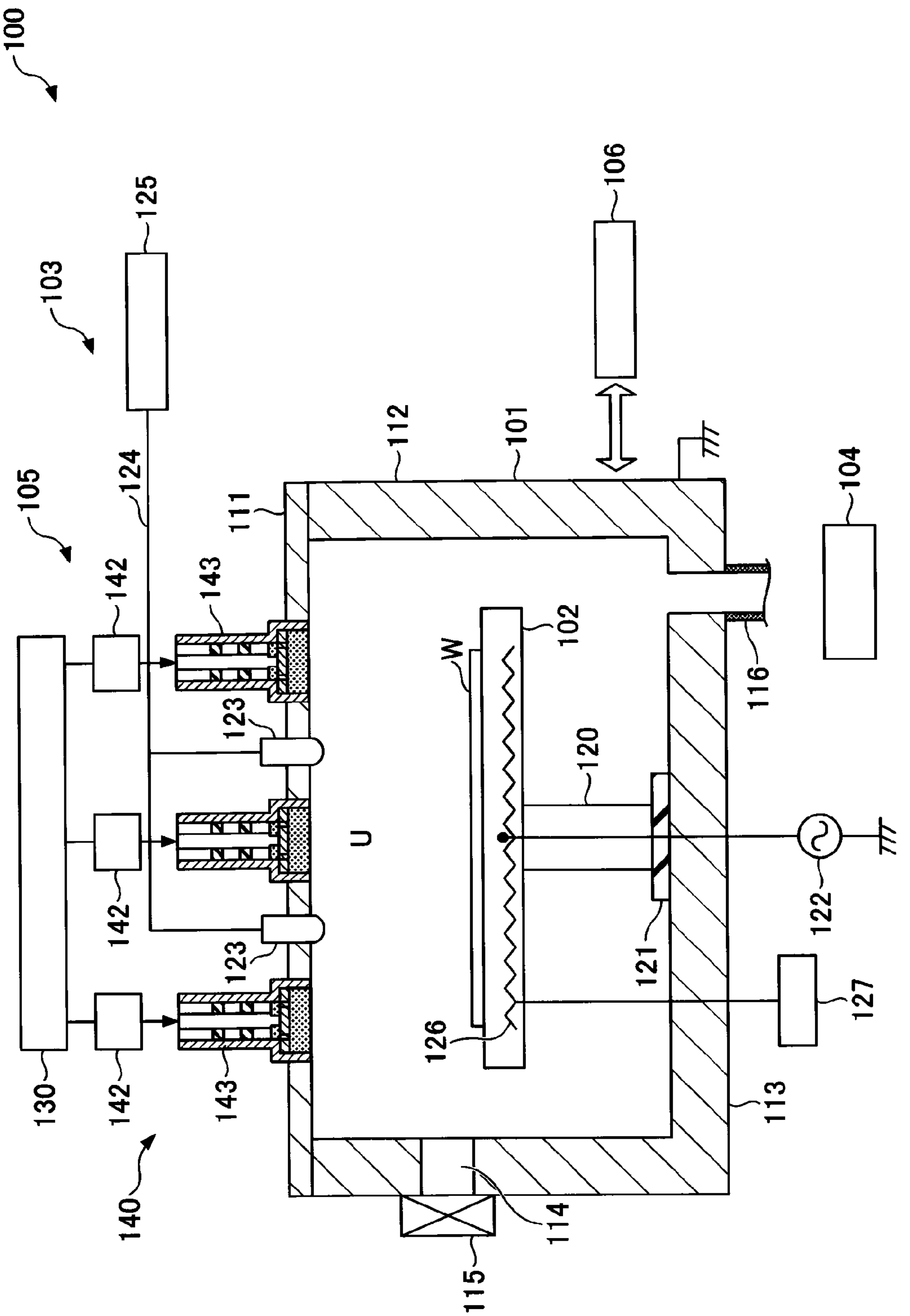
FIG. 1 is a cross-sectional view schematically illustrating an example of a plasma processing apparatus according to an embodiment.

Hereinafter, embodiments for executing the present disclosure will be described with reference to drawings. In the specification and drawings, constituent elements that are substantially the same will be denoted by the same reference numerals, and redundant descriptions will be omitted.

[Apparatus Configuration]

An example of a plasma processing apparatus for executing a film forming method of the present disclosure will be described. FIG. 1 is a cross-sectional view schematically illustrating an example of a plasma processing apparatus 100 according to an embodiment.

The plasma processing apparatus 100 includes a processing container 101, a stage 102, a gas supply mechanism 103, an exhaust mechanism 104, a microwave plasma source 105, and a controller 106.

The processing container 101 is made of a metal material, for example, aluminum having an anodized surface, and has a substantially cylindrical shape. The processing container 101 includes a plate-shaped ceiling wall 111, a bottom wall 113, and a side wall 112 connecting the ceiling wall 111 and the bottom wall 113 to each other. The inner wall of the processing container 101 may be coated with yttria ($Y_2O_3$) or the like. The stage 102 is disposed within the processing container 101. The processing container 101 accommodates a wafer W such as a substrate.

The ceiling wall 111 includes a plurality of openings into which microwave radiation mechanisms 143 and gas introduction nozzles 123 (to be described later) of the microwave plasma source 105 are fitted. The side wall 112 includes a carry-in/out port 114 to carry a wafer W (a target substrate) into/out of a transport chamber (not illustrated) adjacent to the processing container 101. The carry-in/out port 114 is configured to be opened and closed by a gate valve 115. An exhaust pipe 116 is connected to the bottom wall 113.

The stage 102 has a disk shape and is made of a metal material, for example, aluminum having an anodized surface, or a ceramic material, for example, aluminum nitride (AlN). A wafer W is placed on the top surface of the stage 102. The stage 102 is supported by a support member 120, which is a metal cylinder extending upward from the center of the bottom of the processing container 101 via an insulating member 121.

In addition, inside the stage 102, lifting pins (not illustrated) configured to raise/lower the wafer W are provided to be capable of protruding/retracting with respect to the top surface of the stage 102. In addition, a heater 126 is provided inside the stage 102 as a heating mechanism. The heater 126 is powered by a heater power source 127 to generate heat. By controlling the output of the heater 126 based on a temperature signal from a sensor (e.g., a thermocouple) provided near the top surface of the stage 102, the wafer W is controlled to a predetermined temperature.

From the viewpoint of performing good plasma processing, the stage 102 is provided at a position at which the distance from the bottom surface of the ceiling wall 111, which is the microwave radiation surface of the microwave radiation mechanism 143, to the wafer W is preferably in the range of 40 to 200 mm.

A radio frequency power source 122 is electrically connected to the stage 102. When the stage 102 is made of ceramic, an electrode is provided on the stage 102, and the radio frequency power source 122 is electrically connected to the electrode. The radio frequency power source 122 applies radio frequency power as bias power to the stage 102. The frequency of the radio frequency power applied by the radio frequency power source 122 is preferably in the range of 0.4 to 27.12 MHz.

The gas supply mechanism 103 supplies various processing gases for performing film formation into the processing container 101. The gas supply mechanism 103 includes a plurality of gas introduction nozzles 123, a gas supply pipe 124, and a gas supplier 125. The gas introduction nozzles 123 are fitted into respective openings formed in the ceiling wall 111 of the processing container 101. The gas supplier 125 is connected to each gas introduction nozzle 123 via the gas supply pipe 124. The gas supplier 125 supplies various processing gases. For example, the gas supplier 125 includes a first gas source, a second gas source, and a third gas source. A first gas supplied by the first gas source is an inert gas, such as $N_2$ gas, Ar gas, or He gas. Alternatively, Kr gas, Xe gas, Ne gas, or the like may be used as the first gas. A second gas supplied by the second gas source is a reducing gas, such as $NH_3$ or $N_2$. As the second gas, $N_2$ gas is initially used to suppress warping of the substrate and switched to $NH_3$ gas, which does not affect the quality of a film before a film forming process, and the $NH_3$ gas is continuously used in the film forming process. A third gas supplied by the third gas source is $SiH_4$ gas, $SiH_2Cl_2$ gas, or the like, which may be a raw-material gas. In addition, the gas supplier 125 is provided with a valve configured to perform supply and stop of a processing gas and a flow rate adjuster configured to adjust the flow rate of a processing gas.

An exhaust pipe 116 is connected to the bottom wall 113 of the processing container 101. The exhaust mechanism 104 is connected to the exhaust pipe 116. The exhaust mechanism 104 includes a vacuum pump and a pressure control valve and is capable of exhausting the interior of the processing container 101 through an exhaust pipe 116 by the vacuum pump. The pressure inside the processing container 101 is controlled by a pressure control valve (not illustrated) based on the value of a pressure gauge.

The microwave plasma source 105 is provided above the processing container 101. The microwave plasma source 105 introduces electromagnetic waves (microwaves) into the processing container 101 to generate plasma.

The microwave plasma source 105 includes a microwave output part 130 and an antenna unit 140. The antenna unit 140 includes a plurality of antenna modules. In FIG. 1, the antenna unit 140 includes three antenna modules. Each antenna module includes an amplifier 142 and a microwave radiation mechanism 143. The microwave output part 130 generates microwaves and distributes and outputs the microwaves to each antenna module. The amplifiers 142 of the antenna module mainly amplify the distributed microwaves and outputs the amplified microwaves to the microwave radiation mechanisms 143. The microwave radiation mechanisms 143 are provided on the ceiling wall 111. The microwave radiation mechanisms 143 radiate the microwaves output from the amplifiers 142 into the processing container 101.

In FIG. 1, the case where three antenna modules are provided in the antenna unit 140 has been described as an example, but the number of antenna modules is not limited. For example, six antenna modules may be provided at the vertices of a regular hexagon in the area of the ceiling wall 111 above the stage 102. By arranging an antenna module at the center position of the hexagon as well, seven antenna modules may be provided.

As long as a microwave power density can be appropriately controlled, a microwave plasma source 105 having a single microwave introducer having a size corresponding to the wafer W may be used.

The controller 106 is, for example, a computer including a processor, a storage, an input device, a display device, and the like. The controller 106 controls each part of the plasma processing apparatus 100. In the controller 106, an operator may perform a command input operation or the like in order to manage the plasma processing apparatus 100 by using the input device. In addition, in the controller 106, the operation situation of the plasma processing apparatus 100 may be visualized and displayed by the display device. Furthermore, the storage of the controller 106 stores control programs and recipe data for controlling various kinds of processing, which are executed in the plasma processing apparatus 100, by the processor. The processor of the controller 106 executes the control programs and controls each part of the plasma processing apparatus 100 according to the recipe data, whereby desired processing is executed in the plasma processing apparatus 100. For example, the controller 106 controls each part of the plasma processing apparatus 100 to execute processing for a film forming method according to the embodiment.

[Preheating of the Present Disclosure]

Preheating is performed, for example, before film formation processing by CVD, for the purpose of suppressing warping of a wafer W, obtaining stable film quality, and the like. In the present disclosure, a SiN film forming process using $NH_3$ and $SiH_4$ as raw material gases will be described. However, the processing gases are not limited thereto.

In the preheating in a SiN film forming process, the wafer W is gradually heated over time until the temperature of the wafer W is stabilized at a temperature suitable for film formation. As for the heating time, the heating is performed gradually over, for example, 120 seconds. It is known that warping of the wafer W can be suppressed to some extent by heating the wafer W gradually (over 120 seconds).

In addition, when the wafer W is placed on the stage 102, the wafer W may be attracted to the stage 102 due to the electrostatic force of the wafer W itself. When the wafer W is warped by being rapidly heated in a state in which the wafer W is attracted to the stage 102, the wafer W may bounce or crack. For this reason, in an adopted method in the related arts, a wafer W is pinned up with wafer support pins to provide a distance between the wafer W and the stage 102, and the wafer W is heated over time with radiant heat from the stage 102.

From the viewpoint of improving productivity (throughput: processing time per one wafer), it is desirable to shorten the preheating time and omit the pin-up operation of the wafer support pins.

Therefore, the present disclosure discloses a method for shortening a time required for preheating a substrate before film formation while suppressing the warp of the substrate, and describes the corresponding method.

Figure 2:
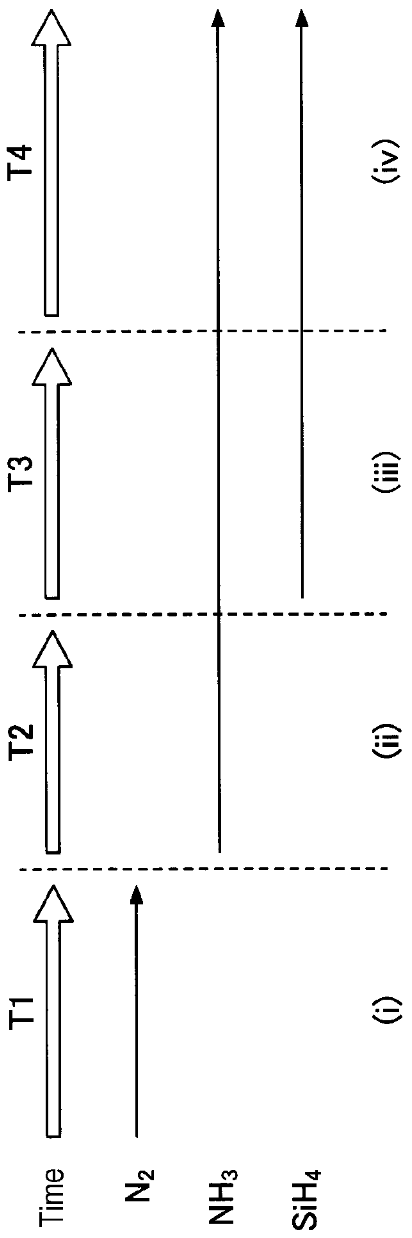
FIG. 2 is an exemplary diagram illustrating timing for supply or stop of various processing gases in a series of processes including preheating.

FIG. 2 is a diagram illustrating timing for supply or stop of various processing gases in a series of processes including preheating.

In (i), $N_2$ gas is supplied, and a first preheating is performed as a first heating process. In the first preheating, $N_2$ gas is supplied into the processing container 101, and the pressure inside the processing container 101 is adjusted to a first pressure. The first pressure is predetermined as a pressure suitable for preheating a wafer W. The time required for the first preheating is set to T1 seconds.

In (ii), the supply of $N_2$ gas is stopped, $NH_3$ gas is supplied, and a second preheating is performed as a second heating process. In the second preheating, in the state in which the pressure inside the processing container 101 is adjusted to the first pressure as in the first preheating, the atmosphere in the processing container 101 is replaced with $NH_3$ gas. The time required for the second preheating is set to T2 seconds.

In (iii), $SiH_4$ gas is supplied in the state in which $NH_3$ gas is supplied, and the pressure is stabilized at a second pressure lower than the first pressure. The time required for stabilization is set to T3 seconds. The second pressure is predetermined as a pressure suitable for film formation, that is, a pressure at which plasma is easily ignited. $SiH_4$ gas including $NH_3$ gas is an example of the third gas. The supply of $SiH_4$ gas may be started between (iii) and (iv).

In (iv), a microwave power is turned on to form a film. The time required for film formation is set to T4 seconds. In (iv), a desired film is formed by supplying the second gas and the third gas. In the present disclosure, as an example, $NH_3$ gas and $SiH_4$ gas are supplied to form a SiN film.

Figure 3:
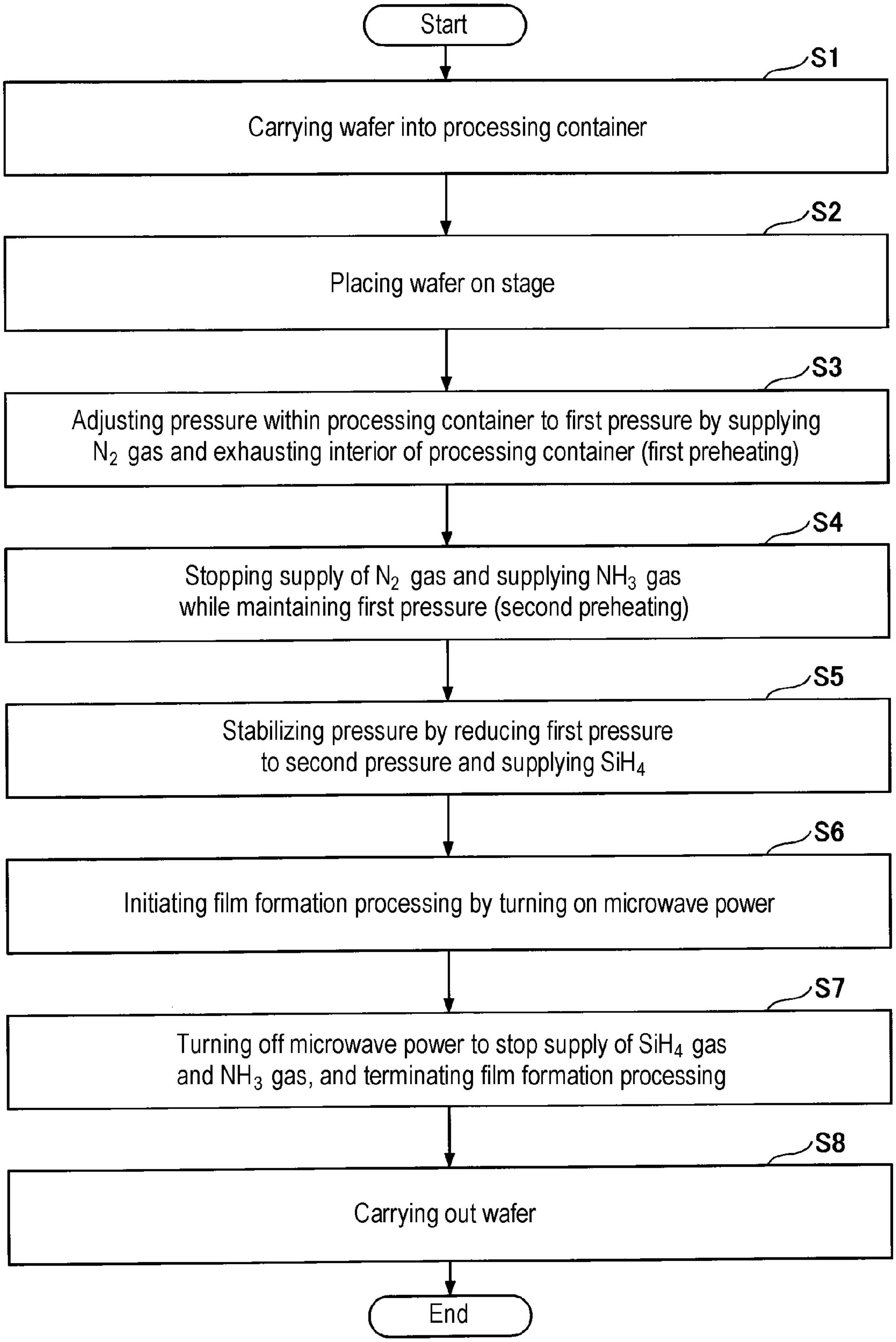
FIG. 3 is an exemplary flowchart illustrating an overview of the processes of a substrate processing method in the present disclosure.

A series of processes including preheating will be described more specifically with reference to FIGS. 1 and 3. FIG. 3 is a flowchart illustrating an overview of the processes of a substrate processing method in the present disclosure.

First, the controller 106 moves a wafer W from a transport chamber (not illustrated), which is maintained in a reduced pressure state by opening the gate valve 115, to the processing container 101 via the carry-in/out port 114 by a transport apparatus (not illustrated) (S1).

Then, the controller 106 raises wafer support pins (not illustrated) to receive the wafer W, carries out the transport apparatus, and then lowers the wafer support pins (not illustrated) to place the received wafer W on the stage 102 for preparation (S2).

Next, the controller 106 closes the gate valve 115 and adjusts the pressure inside the processing container 101 to the first pressure by supplying $N_2$ gas from the gas supplier 125 into the processing container 101 at a predetermined flow rate and exhausting the interior of the processing container 101 (S3). The first pressure is preferably 20 to 667 Pa, for example, 333 Pa (2.5 Torr). After the start of the supply of the $N_2$ gas, before the start of the supply, or at the same time as the start of the supply, the heating of the wafer W is started as the first preheating. Specifically, the stage 102 is heated by feeding power from the heater power source 127 to the heater 126, and the temperature of the wafer W is controlled to a desired temperature by the heat. The time for the first preheating is T1 seconds. The first preheating is a part of the preheating process for raising the temperature of the wafer W to a temperature suitable for film formation.

After the first preheating (after T1 seconds have elapsed), the controller 106 stops the supply of the $N_2$ gas from the gas supplier 125 while maintaining the first pressure, and supplies $NH_3$ gas from the gas supplier 125 into the processing container 101 at a predetermined flow rate (S4). This process is the second preheating. Switching from the first preheating to the second preheating is performed at a predetermined time based on, for example, evaluation results or the like. In addition, switching from the first preheating to the second preheating may be performed based on an output signal output to the heater 126 by the controller 106. The time for the second preheating is T2 seconds. The controller 106 performs control so that the temperature is raised to a temperature suitable for film formation by the first preheating and the second preheating (i.e., T1+T2 seconds (e.g., about 40 seconds)).

After the second preheating (after T2 seconds have elapsed), the controller 106 reduces the pressure inside the processing container 101 from the first pressure to a second pressure lower than the first pressure while maintaining the supply of NH 3 gas from the gas supplier 125 into the processing container 101. In addition, the controller 106 supplies, for example, $SiH_4$ gas into the processing container 101 at a predetermined flow rate from the gas supplier 125 to stabilize the pressure inside the processing container 101 to the second pressure (S5). The time for this gas stabilization process prior to the film forming step may be set to, for example, 5 seconds or more and 50 seconds or less, preferably 10 seconds or more and 30 seconds or less. In addition, the second pressure is preferably 6.7 to 133 Pa, for example, 16 Pa (120 mTorr).

Then, after the pressure is stabilized in the gas stabilization step (after T3 seconds have elapsed, specifically after determining that the pressure monitoring result has been stabilized), the controller 106 turns on the microwave power to ignite plasma and starts film formation processing on the wafer W (S6). That is, microwaves from the microwave output part 130 are radiated to the space above the wafer W in the processing container 101 via the microwave radiation mechanism 143. An electromagnetic field is formed in the processing container 101 by the microwaves radiated to the processing container 101, and the $NH_3$ gas and $SiH_4$ are plasmatized. Then, a SiN film is uniformly formed on the surface of the wafer W by the action of active species in the plasma, mainly N radicals. The film to be generated varies depending on processing gases, and may be an insulating film containing oxygen or nitrogen, a dielectric film, a metal film, or the like, in addition to the SiN film. For example, when the raw-material gases are $SiH_4$ and $N_2O$, an oxide film of $SiO_2$ (an insulating film) may be produced. In addition, for example, when the raw-material gases are $SiH_2Cl_2$ and $NH_3$, a dielectric film of $Si_3N_4$ may be produced. Furthermore, for example, when the raw-material gases are $WF_6$ and Si, a metal film of 2WSi may be produced.

After performing the film formation processing for a predetermined time, the controller 106 turns off the microwave power, stops the supply of $SiH_4$ gas and the $NH_3$ gas, and terminates the film formation processing (S7).

Thereafter, the wafer support pins (not illustrated) are raised in the reverse order of steps S1 and S2, and the wafer W is carried out by the transport apparatus (not illustrated) (S8).

[Preheating Time]

The preheating of the present disclosure includes two steps: a first preheating process and a second preheating process. That is, the time required for preheating is the sum of the time T1 required for the first preheating process and the time T2 required for the second preheating process. Here, the degree of influence of the preheating time of the present disclosure on the quality of the film to be formed will be described.

Figure 4:
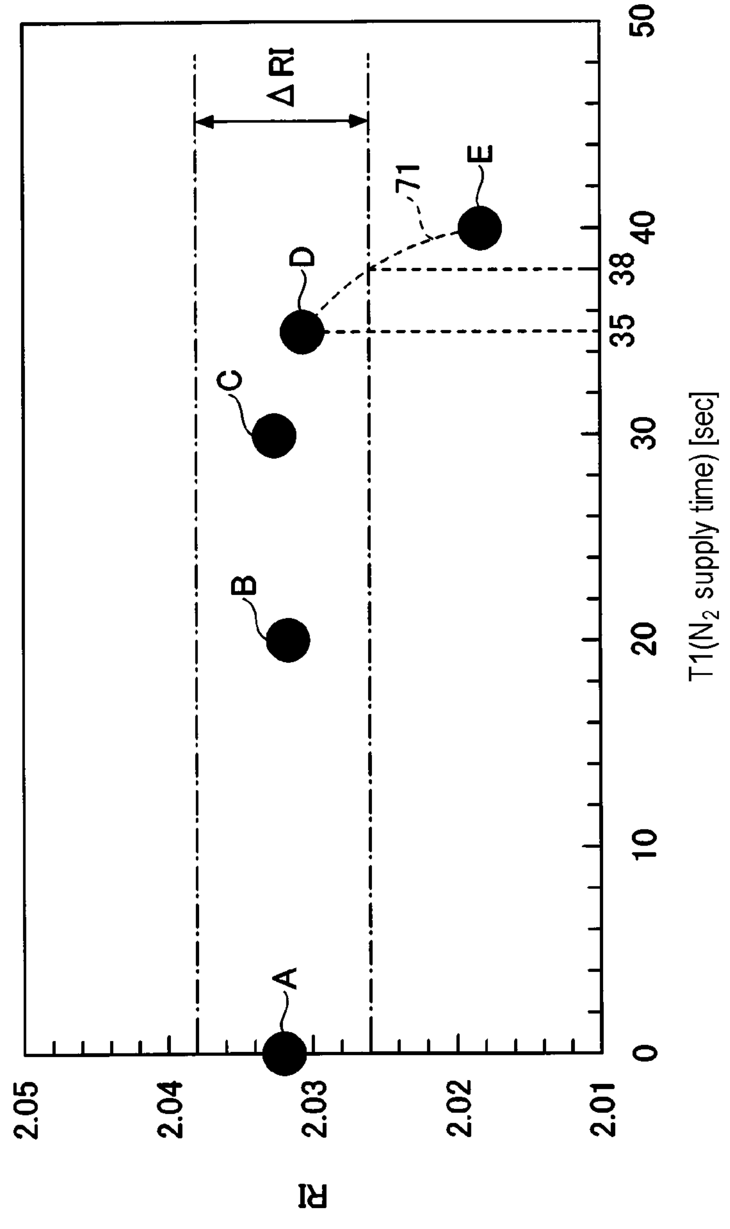
FIG. 4 is a diagram illustrating the influence of the supply time of $N_2$ gas supplied in a first preheating process on film quality in two-step preheating of the present disclosure.

FIG. 4 is a diagram illustrating the influence of the supply time of $N_2$ gas supplied in the first preheating process on film quality in the two-step preheating of the present disclosure. Here, in the two-step preheating, film formation processing was performed under the following five conditions A to E for the supply time of $N_2$ gas supplied in the first preheating process. As already described, $N_2$ gas is supplied in the first preheating performed during T1 seconds, and $NH_3$ gas is supplied in the second preheating performed during T2 seconds.

A. T1=0 seconds, T2=120 seconds (reference example: preheating in the related art (including pin-up operation))
B. T1=20 seconds, T2=20 seconds
C. T1=30 seconds, T2=10 seconds
D. T1=35 seconds, T2=5 seconds
E. T1=40 seconds, T2=0 seconds The horizontal axis of FIG. 4 represents time [sec], and the vertical axis represents refractive index (RI) of an obtained film, which is an index of film quality. Points A to E are RIs corresponding to conditions A to E, respectively. Since only $NH_3$ is used in preheating of the related arts, conditions B to E were evaluated by using the RI obtained under condition A as a reference value.

As shown in FIG. 4, similar RIs were obtained at conditions A, B, C and D. In contrast, under condition E, the value of the RI clearly decreased. From this result, it can be said that when the preheating time in two steps is set to 40 seconds (T1+T2=40 seconds), the second preheating time T2 is preferably at least 5 seconds.

Between condition D and condition E (T1=35 to 40 seconds or T2=0 to 5 seconds), it is expected that as the time T1 for supplying the $N_2$ gas becomes longer, the RI will be lowered. In other words, it is expected that as the time T2 for supplying the $NH_3$ gas becomes shorter, the RI will be lowered. In FIG. 4, the dotted line 71 interpolates between the data of conditions D and E. The allowable range of RI is ±0.005 relative to the RI of condition A and is indicated as ΔRI. From the intersection point of the dotted line 71 and the lower limit of ΔRI, when T2 is about 2 seconds (38 seconds on the graph) or longer, appropriate film quality is obtained. In this way, the time T2 for supplying the $NH_3$ gas is preferably 5 seconds or longer, and at least 2 seconds.

When expressing the ratio of the second preheating time T2 to the first preheating time T1, the ratio at which warping is suppressed and appropriate film quality is obtained is 1:1 (T1=T2=20 seconds) to 7:1 (T1=35 seconds and T2=5 seconds).

In addition, it is considered that the reason why the RI becomes small when the time T2 for supplying $NH_3$ gas is short (appropriate film quality is not obtained) is that $N_2$ supplied by the first preheating remains in the processing container 101 during film formation processing.

[Determination of Warping]

Figure 5A:
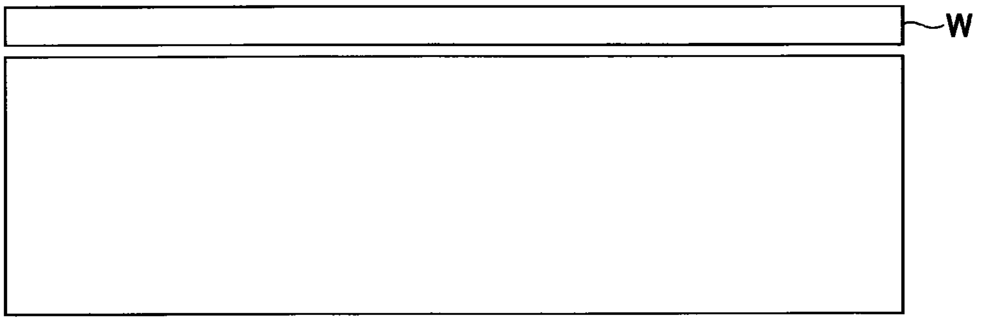
FIGS. 5A and 5B are image views illustrating the warping of a wafer W.
Figure 5B:
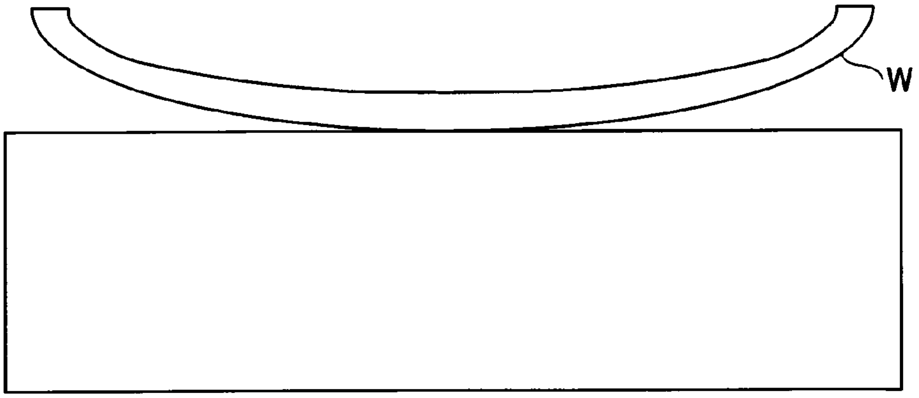
Figure 6:
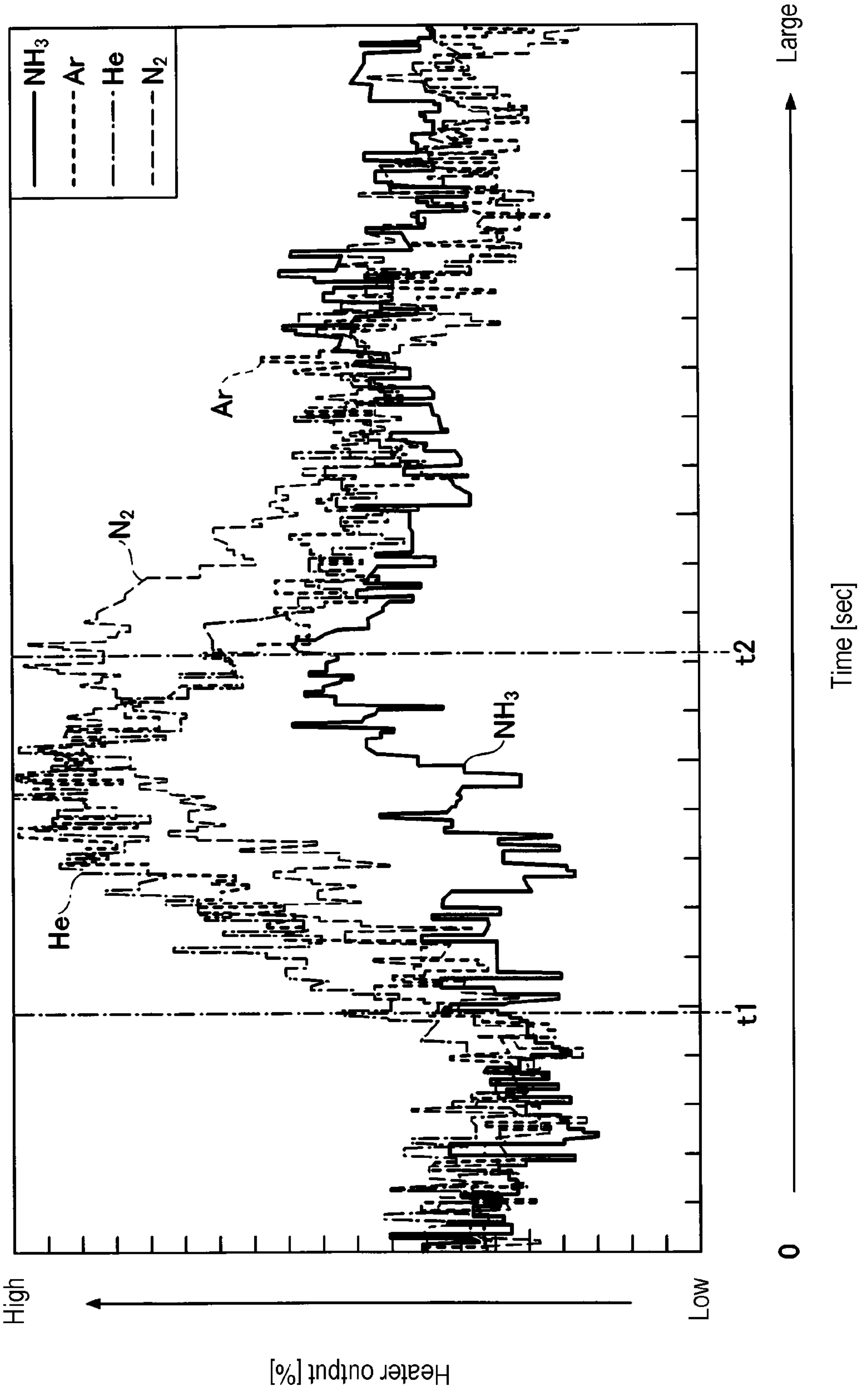
FIG. 6 is a view illustrating an example of heater outputs in preheating in which various gases that can be used for preheating were supplied.

With reference to FIGS. 5A and 5B and FIG. 6, a method for determining the warping of a wafer W, which is one of the problems in the present disclosure, will be described. FIGS. 5A and 5B are image views illustrating the warping of a wafer W. FIG. 5A illustrates a wafer W that has not been warped, and FIG. 5B illustrated a wafer W that has been warped. By visually observing the warping of a wafer W, for example, through a window (not illustrated) provided in the side wall 112 of the processing container 101, the state of the wafer W warped as illustrated in FIGS. 5A and 5B can be confirmed.

In addition, as a method for detecting the warping of a wafer W other than visual observation, there is a method focusing on a heater output. Specifically, it is a method of determining the warping of a wafer from values of output data of the heater power source 127 that feeds power to the heater 126 built in the stage 102. When warping occurs, the contact area between the stage 102 and the wafer W is reduced as illustrated in FIG. 5B. When viewed from the heater power source 127, as the contact area becomes smaller, the heat capacity of the object to be heated becomes smaller, and it becomes possible to heat the object to a target temperature with a small heater output. That is, on the premise that the wafer W is heated to the same temperature, the following relationships exist.

The heater output is small→warping occurs

Heater output is large→No warping

This relationship is consistent with visual determination. Therefore, the presence or absence of warping can be determined by recording the heater output during preheating.

FIG. 6 is a view illustrating an example of heater outputs in preheating in which various gases that can be used for preheating were supplied. The horizontal axis in FIG. 6 represents time [sec], and the vertical axis represents heater output [%]. In FIG. 6, preheating was performed by placing a wafer W on a stage 102, and supplying each of four gases, namely $NH_3$ gas, Ar gas, He gas, and $N_2$ gas, which can be used for preheating, into the processing container 101.

Considering the heater output from time t1 to t2, the heater output of $NH_3$ gas is obviously smaller than those of Ar gas, He gas, and $N_2$ gas. That is, it is shown that warping easily occurred in the preheating in the state in which $NH_3$ gas was supplied, but in the preheating in the state in which any of Ar gas, He gas, or $N_2$ gas supplied, warping was difficult to occur. These results are also consistent with visual determination. In this way, warping can be detected from the output data of the heater power source 127. From the above, it can be said that as the first gas, any one of Ar gas, He gas, and $N_2$ gas, or a combination of these gases, in which warping is difficult to occur in a wafer W, is preferable.

[Examination of Factors Causing Warping]

Figure 7:
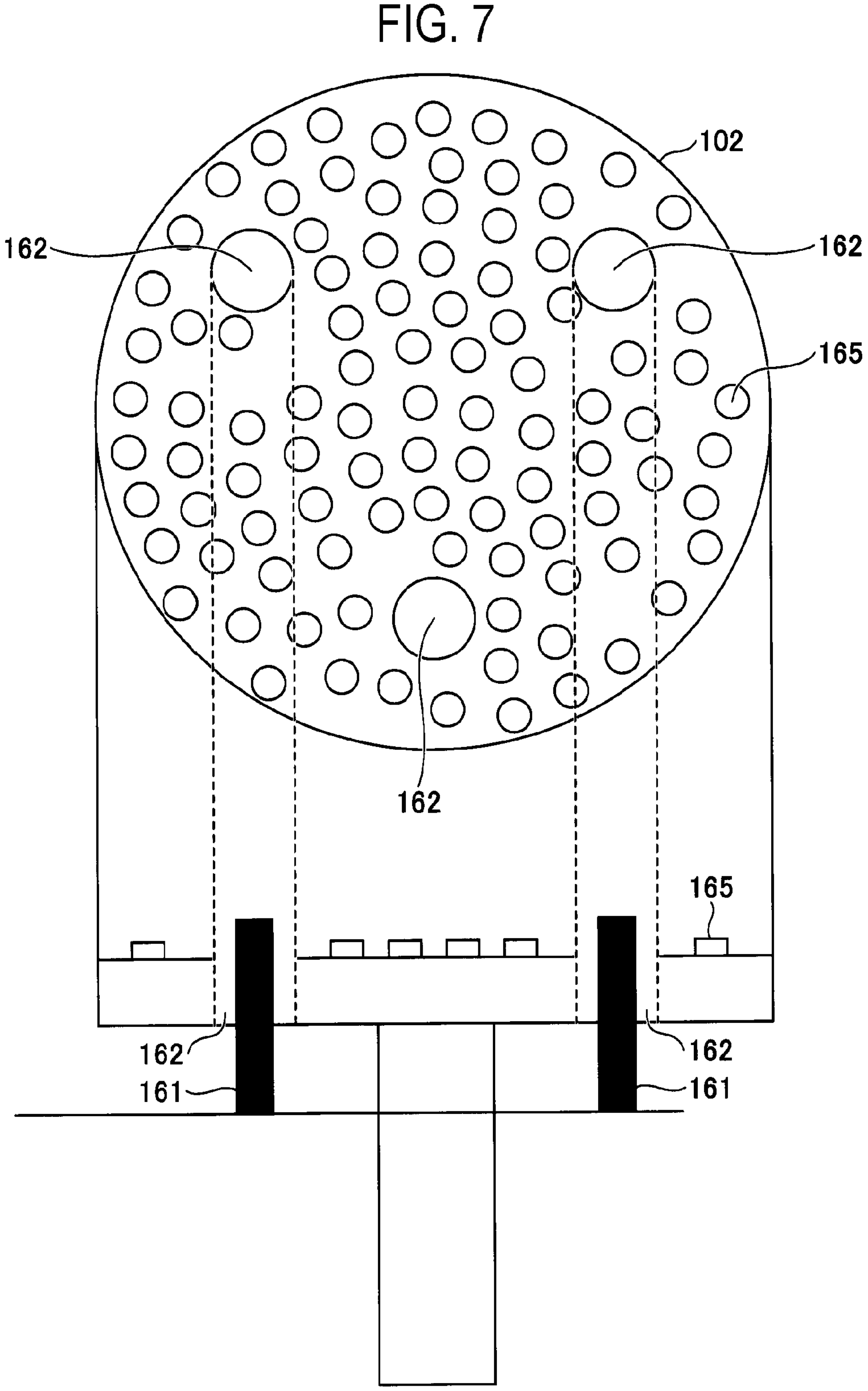
FIG. 7 is a view illustrating a top view and a cross-sectional view of an example of a stage.

Next, with reference to FIGS. 7 to 9, the causes of warping will be examined. FIG. 7 illustrates a top view and a cross-sectional view of the stage 102. The stage 102 is provided with three through holes 162 through which the wafer support pins 161 move to raise and lower a wafer W. In addition, a plurality of protrusions 165 is formed on the top surface of the stage 102 by emboss processing. Thus, even when the wafer support pins 161 are lowered and the wafer W is placed on the surface of the stage 102, spaces are formed between the top surface of the stage 102 and the bottom surface of the wafer W. Therefore, a gas supplied to the processing container 101 is allowed to flow from the bottoms to the tops of the through holes 162. The plurality of protrusions 165 formed by emboss processing is formed to prevent the wafer W from sticking to the surface of the stage 102.

Figure 8A:
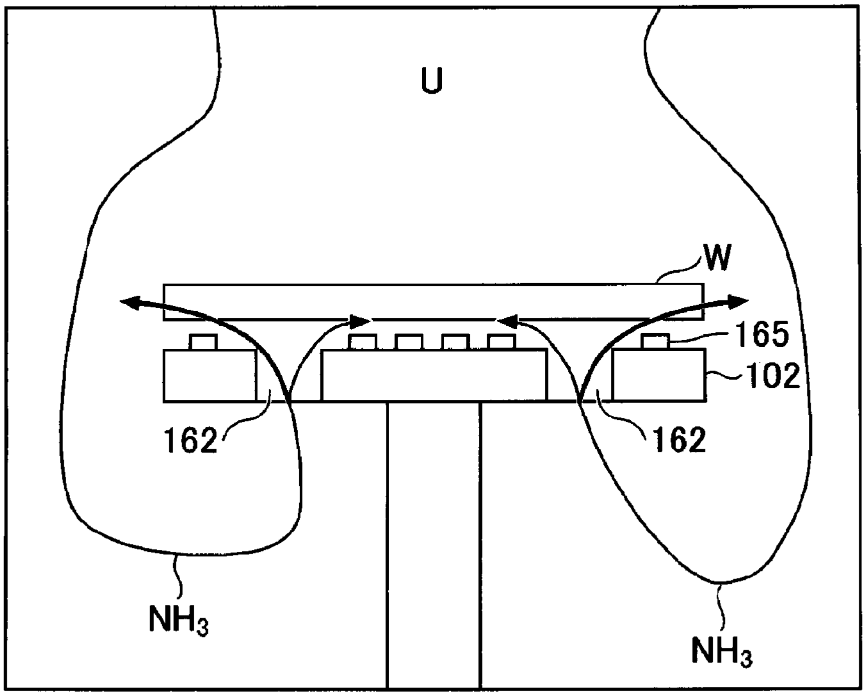
FIGS. 8A and 8B are exemplary views illustrating the flows of gases supplied to the processing container.
Figure 8B:
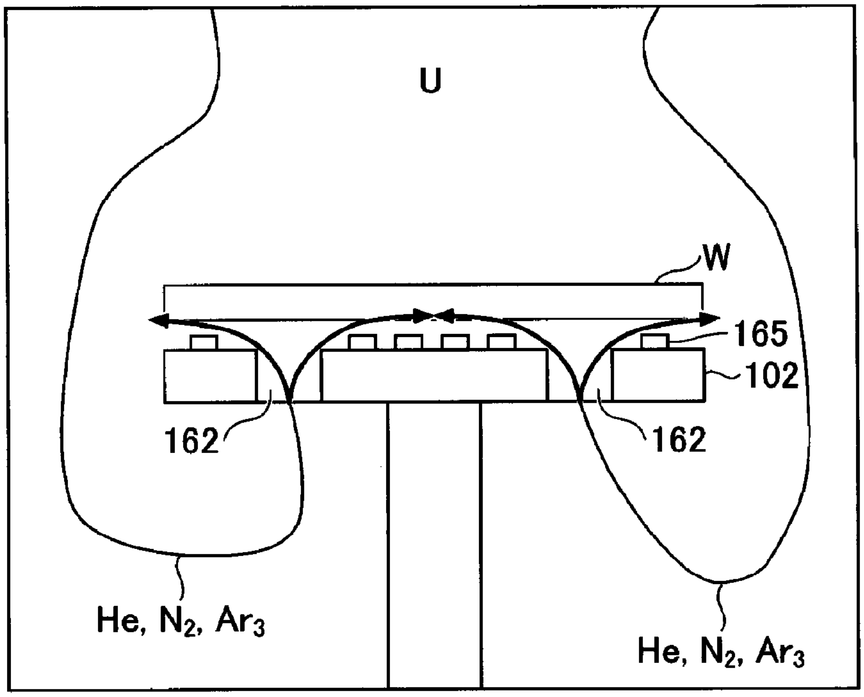

FIGS. 8A and 8B are views illustrating the flows of gases supplied to the processing container 101. It is considered that the gas supplied from the ceiling wall of the processing container 101 passes through the processing space U, passes through the space below the stage 102 from the outer periphery of the stage 102, and inflows from the bottoms to the tops of the through holes 162.

The inflowing gas reaches the lower surface (rear surface) of the wafer W. However, since the plurality of protrusions 165 is formed on the surface of the stage 102, it is difficult for the gas to spread uniformly over the entire bottom surface (rear surface) of the wafer W. For example, since pressures are applied to the central portion of the stage 102 so that the gas inflows from each of the three through holes 162 and cancel each other, it is difficult for the gas to reach the central portion from any direction of the three through holes 162. Therefore, the gas inflowing upward from the bottoms of the through holes 162 tends to escape from the outer periphery of the wafer W. In addition, it is considered that the degree of ease of escaping from the outer periphery is affected by the viscosity coefficient of the gas.

In addition, as it becomes more difficult for the gas to reach the center of the stage 102 and as it becomes easier for the gas to escape from the outer periphery, a temperature difference is likely to occur between the central portion and the outer peripheral portion of the wafer W (lower at the center and higher at the outer periphery). That is, warping is likely to occur.

FIG. 9 illustrates an example of viscosity coefficients of $NH_3$ gas, He gas, $N_2$ gas, and Ar gas at 20 degrees C. The viscosity coefficient of $NH_3$ gas is about 45% to 55% of those of He gas, $N_2$ gas, and Ar gas. Thus, it can be seen that $NH_3$ gas has the lowest viscosity coefficient.

Descriptions will be made returning back to FIGS. 8A and 8B. FIG. 8A is a view illustrating the flow of $NH_3$ gas supplied to the processing container 101 in consideration of viscous resistance. Since the $NH_3$ gas inflowing upward from the bottoms of the through holes 162 has a smaller viscosity coefficient than He gas, $N_2$ gas, and Ar gas, it is presumed that it is difficult for the $NH_3$ gas to reach the center of the stage 102 and that the $NH_3$ gas easily escapes from the outer periphery.

FIG. 8B is a view illustrating the flow of He gas, $N_2$ gas, or Ar gas supplied to the processing container 101 in consideration of the viscosity coefficient. Since the He gas, $N_2$ gas or Ar gas inflowing upward from the bottoms of the through holes 162 has a higher viscosity coefficient than that of $NH_3$ gas, it is presumed that the He gas, $N_2$ gas or Ar gas easily reaches the center of the stage 102 and that it is difficult for the He gas, $N_2$ gas or Ar gas to escape from the outer periphery.

Figure 10:
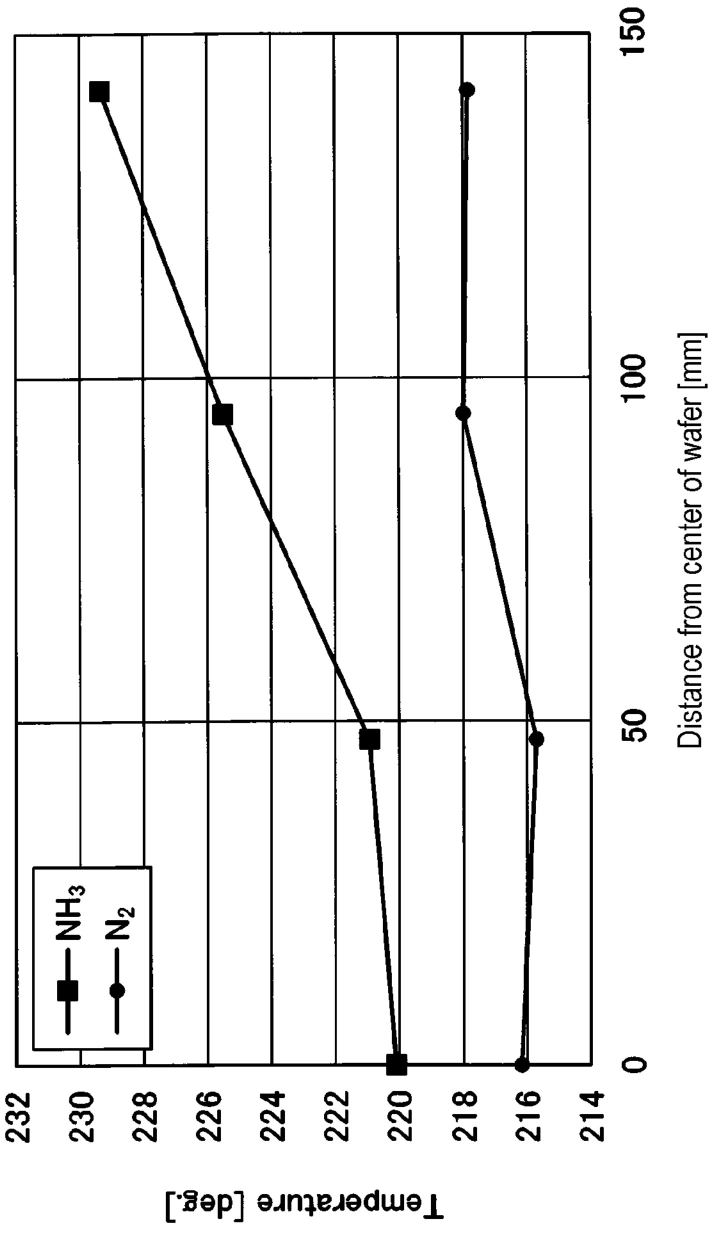
FIG. 10 is a diagram illustrating temperature distributions in the radial direction of wafers W when each of $NH_3$ gas and $N_2$ gas was supplied and heated for a specific time.

FIG. 10 is a diagram illustrating temperature distributions in the radial direction of wafers W when each of $NH_3$ gas and $N_2$ gas was supplied into the processing container 101 and heated for a specific time. The horizontal axis represents a radial distance from the center of the wafer W. 0 mm on the horizontal axis indicates the center of the wafer W having a diameter of 300 mm, and 148 mm on the horizontal axis indicates the outer peripheral portion of the wafer W. The vertical axis represents the temperature at each distance from the center of the wafer W. Specifically, the line of $NH_3$ gas illustrates a temperature distribution in the radial direction of the wafer W when the temperature of the stage 102 was set to 320 degrees C., and the wafer W was placed on the stage 102 and heated for a specific time (6 seconds) while $NH_3$ gas was supplied. The line of $N_2$ gas illustrates a temperature distribution in the radial direction of the wafer W when the temperature of the stage 102 was set to 320 degrees C., and the wafer W was placed on the stage 102 and heated for a specific time (6 seconds) while $N_2$ gas was supplied.

From the results illustrated in FIG. 10, it was found that when $NH_3$ gas was supplied, the temperature of the wafer W increased from the center toward the outer periphery. In contrast, it was found that when $N_2$ gas was supplied, the temperature of the wafer W changed very little from the center to the outer periphery, so the temperature distribution was uniform. In addition, although not illustrated, He gas and Ar gas other than $N_2$ gas showed the same tendency as $N_2$ gas.

As described above, it is considered that when $NH_3$ gas is supplied, since it is difficult for the $NH_3$ gas to reach the central portion of the stage 102 and the $NH_3$ gas easily escapes from the outer periphery, the heating of the wafer W becomes non-uniform, causing a temperature difference to occur between the central portion and the outer peripheral portion of the wafer W, and as a result, warping occurs in the wafer W. On the other hand, it is considered that since He gas, $N_2$ gas, or Ar gas easily reaches the central portion of the stage 102 and it is difficult for the He gas, $N_2$ gas or Ar gas to escape from the outer periphery, the heating of the wafer W becomes uniform, not causing a temperature difference between the central portion and the outer peripheral portion of the wafer W, and as a result, warping does not occur in the wafer W. From the above, as the first gas, it is preferable to use any one of Ar gas, He gas, and $N_2$ gas, or a combination of these gases, in which warping is difficult to occur in the wafer W. However, in addition to He gas, $N_2$ gas, or Ar gas, an inert gas having high viscous resistance may be applicable as the first gas.

[Main Effects]

As described above, the substrate processing method of the present disclosure makes it possible to uniformly heat the surface of a wafer W by performing a first preheating by using an inert gas (e.g., $N_2$ gas or the like). Therefore, it is possible to suppress warping of the wafer W that may occur due to heating. In addition, since the warping is suppressed, it is not necessary to preheat the wafer W in a state in which the wafer W is pinned up and supported by the wafer support pins. Since warping is suppressed, the temperature can be raised in a short time, and the productivity (throughput) is improved.

In addition, since the film forming gas is switched during preheating, the substrate processing method can be applied regardless of the type of the film forming gas. In addition, since a purge line for purging a processing gas line (flow path) already installed in the plasma processing apparatus 100 is used to supply the inert gas (e.g., $N_2$ gas), there is no need to add a new gas line.

Although the substrate processing apparatus has been described above based on the embodiments, the substrate processing apparatus according to the present disclosure is not limited to the embodiments, and various modifications and improvements are possible within the scope of the present disclosure. Matters described in the above-described multiple embodiments may be combined within a range in which the matters do not contradict each other.

In the present disclosure, a wafer W has been described as an example, but the object to be plasma-processed is not limited to the wafer W, and may be various substrates used in liquid crystal displays (LCDs) and flat panel displays (FPDs).

In addition, the preheating before CVD film formation processing has been described in the present disclosure, the preheating may also be used for preheating before various heat treatment processes, impurity introduction processes, or planarization processes. In addition, in the present disclosure, preheating for film formation processing by the plasma processing apparatus 100 has been described, but the preheating may also be used for preheating for etching and ashing. Furthermore, the film formation processing is not limited to a method using plasma, and sputtering, thermal oxidation, annealing with various lamps, and the like may be used.

This application claims priority based on Japanese Patent Application No. 2021-18135 filed with the Japan Patent Office on Feb. 8, 2021, and the entire disclosure of Japanese Patent Application No. 2021-18135 is incorporated herein in its entirety by reference.

EXPLANATION OF REFERENCE NUMERALS

100: plasma processing apparatus, 101: processing container, 102: stage, 103: gas source, 105: microwave plasma source, 106: controller, 111: lid, 122: radio frequency bias power source, U: processing space

What is claimed is:

1. A substrate processing method comprising:

a preparation process of placing a target substrate on a stage within a processing container;

a first heating process of supplying a first gas into the processing container and heating the target substrate with a heater in a state in which the target substrate is placed on the stage;

while maintaining the state in which the target substrate is placed on the stage after the first heating process, a second heating process of stopping the supply of the first gas, supplying a second gas different from the first gas, and heating the target substrate with the heater; and a processing process of processing the target substrate by supplying the second gas and a third gas.

2. The substrate processing method of claim 1, wherein, in the processing process, the target substrate is processed with a plasma of the third gas including the second gas.

3. The substrate processing method of claim 2, wherein the first gas is an inert gas, and the second gas is a reducing gas.

4. The substrate processing method of claim 3, wherein the first gas is $N_2$ gas, Ar gas, or He gas, and the second gas is $NH_3$ gas.

5. The substrate processing method of claim 4, wherein the third gas is a gas including $NH_3$ gas and $SiH_4$ gas or a gas including $NH_3$ gas and $SiH_2Cl_2$ gas.

6. The substrate processing method of claim 5, wherein pressures in the first heating process and the second heating process are higher than a pressure in the processing process.

7. The substrate processing method of claim 6, wherein the processing process is a film forming process of forming a desired film by generating a plasma of the second gas and the third gas using microwaves.

8. The substrate processing method of claim 7, wherein a film formed in the processing process is an insulating film containing oxygen or nitrogen, a dielectric film, or a metal film.

9. The substrate processing method of claim 8, wherein the film formed in the processing process is SiN, $SiO_2$, or a laminated film of SiN and $SiO_2$.

10. The substrate processing method of claim 9, further comprising, after the second heating process and prior to the processing process, a stabilization process of stabilizing a pressure within the processing container in a state of supplying the second gas.

11. The substrate processing method of claim 10, wherein a ratio of a time required for the second heating process to a time required for the first heating process is 1:1 to 7:1.

12. The substrate processing method of claim 11, wherein switching from the first heating process to the second heating process is performed based on an output signal of the heater.

13. The substrate processing method of claim 1, wherein the first gas is an inert gas, and the second gas is a reducing.

14. The substrate processing method of claim 1, wherein pressures in the first heating process and the second heating process are higher than a pressure in the processing process.

15. The substrate processing method of claim 1, wherein the processing process is a film forming process of forming a desired film by generating a plasma of the second gas and the third gas using microwaves.

16. The substrate processing method of claim 1, wherein a ratio of a time required for the second heating process to a time required for the first heating process is 1:1 to 7:1.

17. The substrate processing method of claim 1, wherein switching from the first heating process to the second heating process is performed based on an output signal of the heater.

18. A substrate processing apparatus comprising:

a processing container including a stage and configured to be exhausted; and a controller configured to perform control such that a substrate processing method is performed, wherein the substrate processing method includes:

a preparation process of placing a target substrate on the stage within the processing container;

a first heating process of supplying a first gas into the processing container and heating the target substrate with a heater in a state in which the target substrate is placed on the stage;

while maintaining the state in which the target substrate is placed on the stage after the first heating process, a second heating process of stopping the supply of the first gas, supplying a second gas different from the first gas, and heating the target substrate with the heater; and a processing process of processing the target substrate by supplying the second gas and a third gas.

* * * * *